(12) United States Patent
Johancsik et al.

(10) Patent No.: US 8,466,818 B1
(45) Date of Patent: Jun. 18, 2013

(54) TIME-INTERLEAVED ANALOG-TO-DIGITAL CONVERTER BANDWIDTH MATCHING

(75) Inventors: Tracy Johancsik, Murray, UT (US); Ryan James Kier, Salt Lake City, UT (US); Yusuf Haque, Woodside, CA (US)

(73) Assignee: Crest Semiconductors, Inc., San Jose, CA (US)

(*) Notice: Subject to any disclaimer, the term of this patent is extended or adjusted under 35 U.S.C. 154(b) by 20 days.

(21) Appl. No.: 13/309,194

(22) Filed: Dec. 1, 2011

(51) Int. Cl.
*H03M 1/00* (2006.01)

(52) U.S. Cl.
USPC .............................. 341/122; 341/155; 341/156

(58) Field of Classification Search
USPC .......................................... 341/122, 155, 156
See application file for complete search history.

(56) References Cited

U.S. PATENT DOCUMENTS

| | | | | |
|---|---|---|---|---|
| 6,072,355 A | * | 6/2000 | Bledsoe | 327/390 |
| 6,992,509 B2 | * | 1/2006 | Ko et al. | 327/96 |
| 7,075,471 B1 | * | 7/2006 | Gupta | 341/155 |
| 8,009,070 B2 | | 8/2011 | Johansson | |
| 2010/0207792 A1 | * | 8/2010 | Louwsma et al. | 341/122 |
| 2011/0193732 A1 | | 8/2011 | Sestok | |

* cited by examiner

*Primary Examiner* — Jean B Jeanglaude
(74) *Attorney, Agent, or Firm* — Steven L. Nichols; Van Cott, Bagley, Comwali & McCarthy P.C.

(57) ABSTRACT

A time-interleaved Analog-to-Digital Converter (ADC) includes a set of sub-ADC circuits. Each sub-ADC circuit comprises a sample-and-hold circuit. Each sample-and-hold circuit includes a bootstrap circuit for maintaining a constant voltage level between an input terminal of a switch and a gate terminal of the switch, the switch for switching between a sample mode and a hold mode. Each sample and hold circuit also includes a capacitor bank associated with the bootstrap circuit such that a setting of the capacitor bank affects an ON state intrinsic resistance of the switch by affecting the voltage level.

20 Claims, 6 Drawing Sheets

Determine a bandwidth of a sample-and-hold circuit for each of a set of sub-ADC circuits within a time-interleaved ADC
(block 602)

Adjust a bandwidth of at least one of the sub-ADC circuits by adjusting an efficiency of a bootstrap circuit associated with a sample-and-hold circuit of the at least one of the sub-ADC circuits, the adjustment causing bandwidths among the sub-ADC circuits to be more closely matched
(block 604)

*Fig. 6*

TIME-INTERLEAVED ANALOG-TO-DIGITAL CONVERTER BANDWIDTH MATCHING

BACKGROUND

Electronic devices typically make use of both analog and digital signals. An analog signal is a continuous signal which may assume any value. A digital signal is one which may assume one of a discrete set of values. A signal may be in the form of an electrical current or a voltage. Electronic circuitry often includes devices for transferring analog signals into digital signals and vice versa. For example, an Analog-to-Digital Converter (ADC) is used to capture an analog signal and produce an equivalent digital signal.

It is desirable to have an ADC that is able to convert an analog signal into a high resolution digital signal at very high speeds. However, the speed at which an ADC is able to operate is limited by a variety of factors. One way to increase speed is to use a time-interleaved ADC. A time-interleaved ADC includes a number of sub-ADC circuits in parallel. An incoming analog signal is time multiplexed and sent to each of the sub-ADC circuits. The digital output of each of those sub-ADC circuits is then recombined accordingly to produce a final digital signal.

BRIEF DESCRIPTION OF THE DRAWINGS

The accompanying drawings illustrate various examples of the principles described herein and are a part of the specification. The drawings are merely examples and do not limit the scope of the claims.

Throughout the drawings, identical reference numbers designate similar, but not necessarily identical, elements.

DETAILED DESCRIPTION

As mentioned above, a time-interleaved ADC circuit can be used to convert analog signals to digital signals at faster speeds. However, one limitation of a time-interleaved ADC is that each sub-ADC circuit can have a different frequency response due to manufacturing variations in the on-chip circuitry. Each sub-ADC circuit includes a sample-and-hold circuit that is used to sample the input signal on a sampling clock edge and hold that sampled signal value for subsequent signal processing by the sub-ADC circuit The frequency response of the sample-and-hold circuit refers to how the output signal level is affected by frequency of the input signal. The resistance of the switch and the capacitor used to store the sampled signal form a low pass filter. A low pass filter causes the signal level to attenuate at higher frequencies. If the frequency response of each of the sub-ADC circuits is different, then the input signal will attenuate differently for each sub-ADC circuit. This can lead to errors at higher frequencies where the low pass filter has a greater attenuation effect on the input signals.

In light of this and other issues, the present specification discloses a time-interleaved ADC circuit wherein each sub-ADC includes a trimming mechanism to adjust the frequency response of each sub-ADC circuit so that each sub-ADC circuit exhibits a relatively similar frequency response. According to certain illustrative examples, the frequency response of each sub-ADC circuit is trimmed by adjusting the voltage between the input terminal of the switch and the gate terminal of the switch within the sample-and-hold circuit. In the case that the switch is a Metal Oxide Semiconductor Field Effect Transistor (MOSFET) device, the voltage that is adjusted is between the gate terminal and the source terminal of the transistor. By adjusting the gate to source voltage of the transistor, the intrinsic resistance of the transistor while in the ON state is adjusted. Specifically, the gate to source voltage can be decreased in order to cause an increase in the intrinsic resistance of the transistor in the ON state. The increase of the resistance affects the frequency response of the sub-ADC circuit by decreasing the bandwidth.

To cause a decrease in the gate to source voltage of the sample-and-hold circuit, the efficiency of a bootstrap circuit associated with the switch of that sample-and-hold circuit is reduced. The bootstrap circuit is used to maintain a relatively constant gate-to-source voltage across the switch. This is important to maintain the linearity of the sample-and-hold circuit. More detail on the bootstrap circuit will be described below.

The efficiency of the bootstrap is defined by the percentage of the final gate to source voltage compared to the desired swing, which in this example is the supply voltage that charges the main capacitor within the bootstrap circuit. The efficiency of the main bootstrap can be adjusted by adjusting the ratio of the main bootstrap capacitor to the gate capacitance of the switch and any parasitic capacitances on the bootstrapped control signal. Thus, by adding additional load capacitance at the gate of the switch, the efficiency of the bootstrap circuit is reduced. This, in turn, decreases the gate-to-source voltage which increases the intrinsic ON state resistance of the switch.

According to certain illustrative examples, capacitance can be selectively added to the capacitance at the gate of the switch through use of a capacitor bank. The capacitor bank includes a set of capacitors in parallel. Each capacitor is connected to a switch that selectively allows that capacitor to contribute to the total capacitance of the capacitor bank. In some cases, the capacitor bank may be binary weighted. Thus, by setting the discrete capacitance of the capacitor bank, the frequency response of each sub-ADC circuit within the time-interleaved ADC can be adjusted to match.

Through use of methods and systems embodying principles described herein, a time-interleaved ADC circuit can be manufactured with a mechanism to adjust the frequency response of each sub-ADC circuit therein. Specifically, after manufacture, the frequency response of each sub-ADC circuit can be determined. Then, the capacitor bank for each of the sub-ADC circuits is adjusted to decrease the bandwidth of each sub-ADC circuit to match the bandwidth of the sub-ADC circuit having the smallest bandwidth.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with that example is included as described, but may not be included in other examples.

Figure 1:
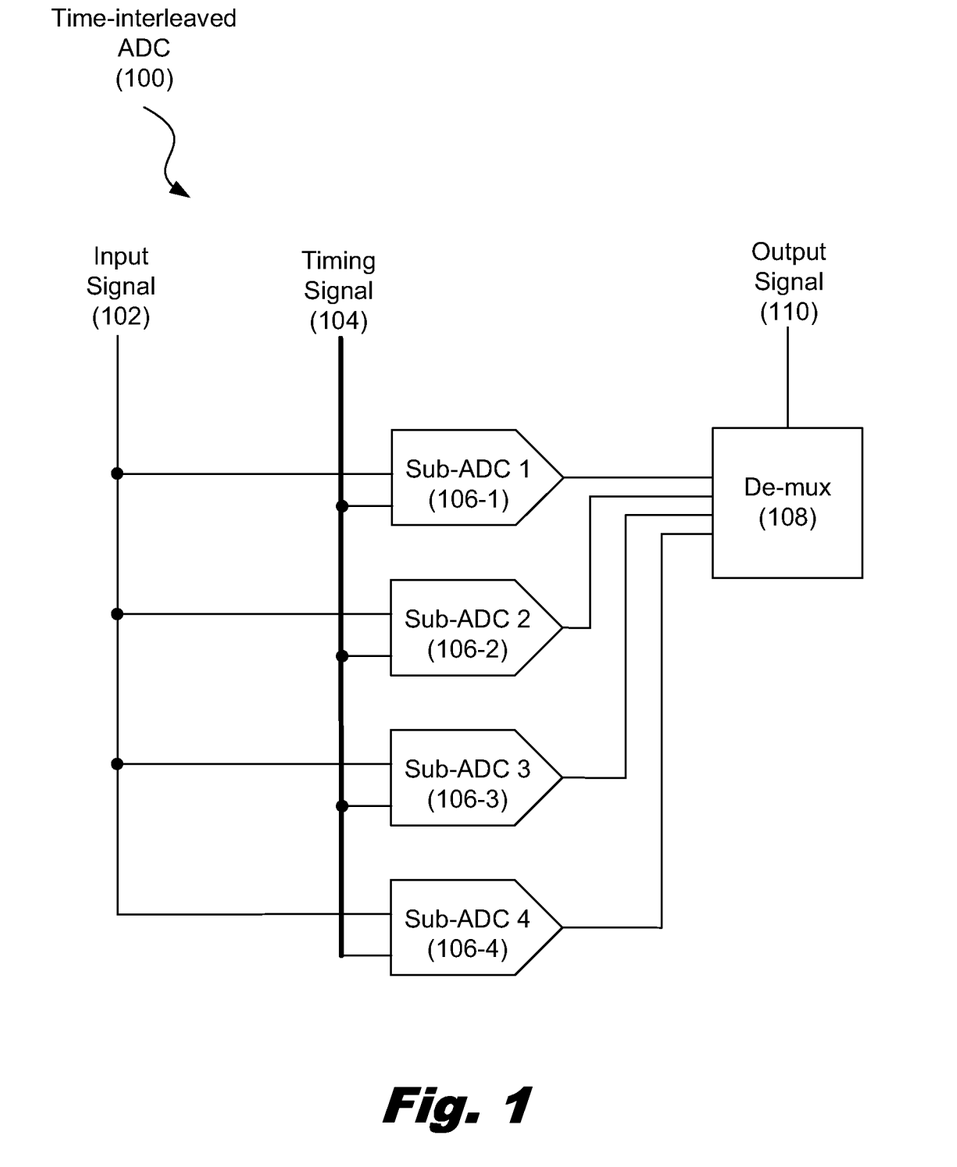
FIG. 1 is a diagram showing an illustrative time-interleaved ADC, according to one example of principles described herein.

Referring now to the figures, FIG. 1 is a diagram showing an illustrative time-interleaved ADC (100). According to certain illustrative examples, the time-interleaved ADC (100) uses a timing signal (104) to control the sample-and-hold signals of a number of sub-ADCs (106). Specifically, the timing signal (104) is such that it causes each sample-and-hold circuit from the different sub-ADCs to switch at different times. Thus, each sample-and-hold circuit will sample the input signal (102) at a different time interval. The output signals from the sub-ADCs (106) can then be sent to a demultiplexer (108) to be recombined into the final output signal (110). The final output signal (110) is thus a digital version of the analog input signal (102).

In the time-interleaved ADC illustrated in FIG. 1, the timing signal (104) is used to divide the analog input signal (102) into different sub-signals according to time. Specifically, at a first sampling instant the input signal (102) is sampled by sub-ADC 1 (106-1). At the next sampling instant, the input signal (102) is sampled by sub-ADC 2 (106-2). This process continues as subsequent sampling instants are sampled by sub-ADC 3 (106-3) and sub-ADC 4 (106-4). At the sampling instant immediately after the one sent to sub-ADC 4 (106-4), the input signal (102) is again sampled by sub-ADC 1 (106-1). Thus, a given sub-ADC (106) samples every fourth sampling instant. Because each sub-ADC (106) only has to process every fourth sampling instant, the overall sampling frequency of the time-interleaved ADC (100) can be increased.

Figure 2:
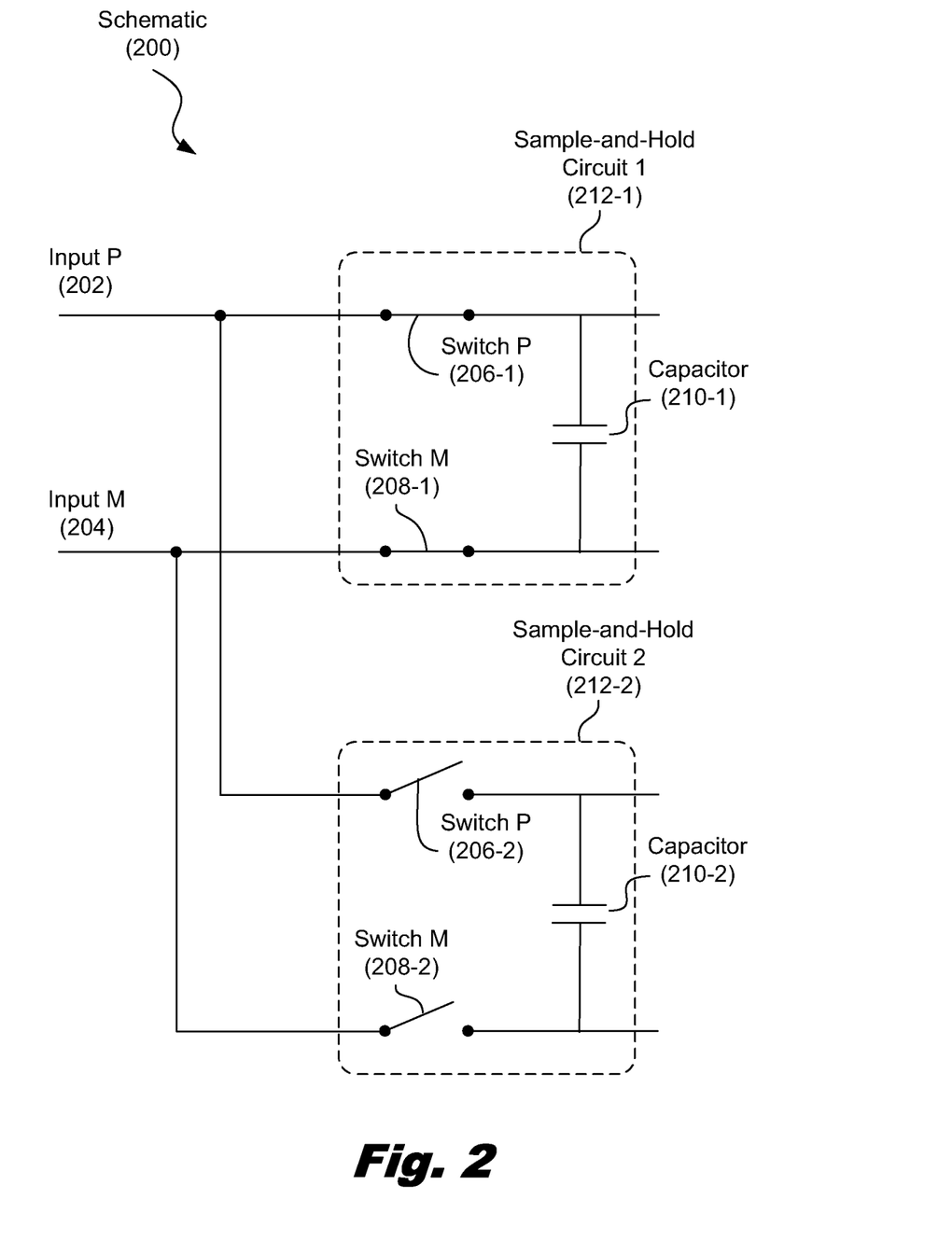
FIG. 2 is a diagram showing an illustrative schematic for sample-and-hold circuits for a sub-ADC circuit, according to one example of principles described herein.

FIG. 2 is a diagram showing an illustrative schematic for two sample-and-hold circuits for two sub-ADC circuits. The sample-and hold circuits illustrated in FIG. 2 are part of a differential time-interleaved ADC with two sub-ADC circuits. A differential ADC measures the difference between two input signals and outputs a discrete digital signal equivalent to that difference. The two inputs are referred to as Input P (202) and Input M (204).

A sample-and-hold circuit is a commonly used circuit within an ADC. The sample-and-hold circuit operates by alternating between a sample mode and a hold mode. While in the sampling mode, the output of the sample-and-hold circuit follows the input of the sample-and-hold circuit. While in the hold mode, the output of the sample-and-hold circuit maintains a constant value. This constant value is the value of the output at the time the sample-and-hold circuit switched from sampling mode to hold mode. Upon returning to sampling mode, the output resumes to follow the level at which the input signal is and continues to track that input signal.

A sample-and-hold circuit typically includes, among other things, a switch and a capacitor. While the sample-and-hold circuit is in sampling mode, the switch is closed. Thus, the signal passes through the switch to the output. The voltage stored on the capacitor also tracks the input signal. When the sample-and-hold circuit switches to hold mode, the switch is opened. The value that was stored on the capacitor at this point now becomes the output signal. Based on the characteristics of the capacitor and switch, this value will begin to drop during the hold mode. However, if the value of the capacitor is chosen correctly along with the hold time, this drop will be negligible for the duration of the hold mode.

In the example of FIG. 2, Sample-and-Hold Circuit 1 (212-1) is in a sampling mode. Both Switch P (206-1) and Switch M (208-1) are closed. Thus, the difference between Input P (202) and Input M (204) will be stored across the capacitor (210-1). When Sample-and-Hold Circuit 1 (212-1) switches to hold mode, the output of Sample-and-Hold Circuit 1 (212-1) will be whatever value was stored in the capacitor at the instant in which the switches (206-1, 208-1) were open. This output will remain relatively constant throughout the duration of the hold mode despite whatever signal variations are still occurring on the inputs (202, 204).

Sample-and-Hold Circuit 2 (212) is currently shown in the hold mode. Because the switches (206-2, 208-2) are open, the input signals do not pass through to the capacitor (210-2). Thus, the capacitor maintains whatever voltage level it was holding at the moment that Sample-and-Hold Circuit 2 (212-2) switched into hold mode. The duration of the hold mode is designed to be such that the rest of the circuitry within the sub-ADC can determine the appropriate discrete digital signal to which the sampled value is closest and output that value.

As mentioned above, the speed at which a sub-ADC circuit is able to operate is dependent, in part, upon the characteristics of the sample-and-hold circuit associated with that sub-ADC. This is because the intrinsic resistance of the switch while in an on position, in combination with the capacitor used to store a signal value, creates a low pass filter. A low-pass filter attenuates signals of a higher frequency while allowing signals of a lower frequency to be relatively unattenuated. Specifically, as the input frequency of the signal being sampled by the sample-and-hold circuit increases, the output signal will begin to attenuate. Due to manufacturing inconsistencies, the intrinsic resistance of each switch in the ON position will be slightly different. This will cause the bandwidth of each sub-ADC signal to be slightly different. This is problematic because at higher input signal frequencies, the outputs of the sample-and-hold circuits for each of the sub-ADCs will be attenuated in a slightly different manner. This can lead to errors in the analog to digital conversion process.

Figure 3A:
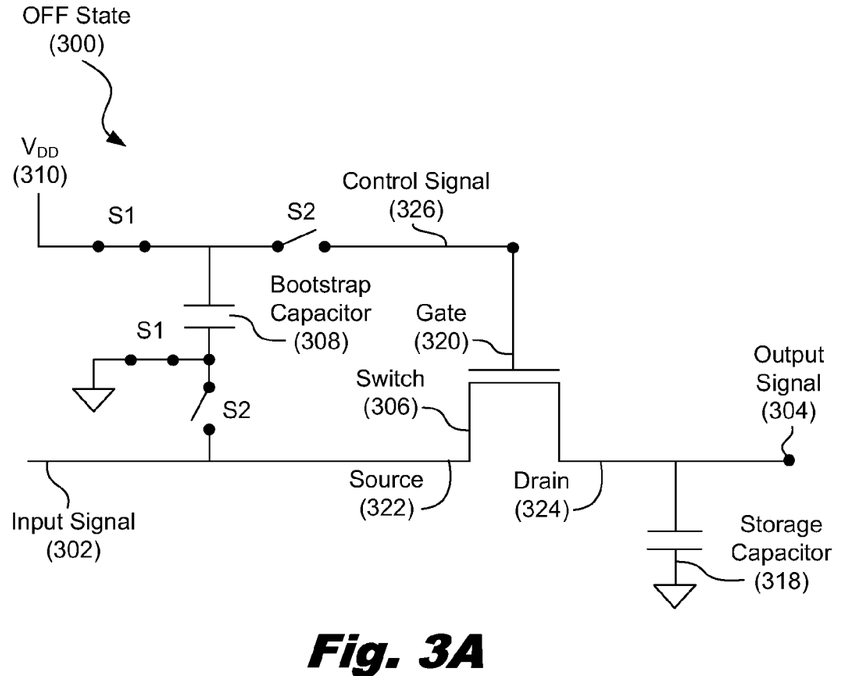
FIG. 3A is a diagram showing an illustrative schematic for a sample-and-hold circuit having a bootstrap circuit and being in an OFF state, according to one example of principles described herein.

FIG. 3A is a diagram showing an illustrative schematic for a sample-and-hold circuit having a bootstrap circuit and being in an OFF state. The main switch of the (306) of the sample-and-hold circuit is used to switch between sample mode and hold mode. The sampled value is stored in the storage capacitor (318) long enough to allow subsequent ADC circuits to process that value. In this example, the main switch is an N-type Field Effect Transistor (FET) device. An N-type transistor is one in which electrical signals are allowed to pass between the source terminal (322) and the drain terminal (324) when there is a relatively high signal at the gate terminal (320) compared to the source terminal (322). Conversely, a relatively low signal at the gate terminal will turn the switch (306) to an OFF state where electrical signals are prohibited from passing between the source terminal (322) and the drain terminal (324).

The intrinsic resistance of the switch (306) while in an ON state is dependent upon the voltage between the gate terminal (320) and the source terminal (322). This voltage is referred to as $V_{GS}$. To maintain the linearity of the switch, it is important that the $V_{GS}$ be relatively constant. However, if the input signal varies while the signal which turns the switch on and off remains constant, then the $V_{GS}$ will be different each time the switch is sampling a varying analog signal. For example a signal may vary between 0.5 volts and 1.5 volts. The gate signal that turns the switch (306) to an ON state may have a value of 1.8 volts, which is equivalent to the voltage supply $V_{DD}$ of the circuit. If the switch is turned on while the input signal is at 1.5 volts, then the $V_{GS}$ is 0.3 volts (1.8−1.5). However, if the switch (306) is turned on while the input signal is 0.5 volts, then the $V_{GS}$ will be 1.3 volts. This difference in the $V_{GS}$ leads to a difference in the ON state intrinsic resistance of the switch (306). This non-linearity leads to problems in the analog to digital conversion process.

To maintain a relatively constant $V_{GS}$ and thus a relatively constant ON state intrinsic resistance, a bootstrap circuit is used. The bootstrap circuit uses a main bootstrap capacitor (308) to store a copy of a reference voltage, which in this case is $V_{DD}$ (310). That copy of the voltage is then added to the input signal (302). While the main sampling switch (306) is in an OFF state as shown in FIG. 3A, the S1 switches are closed while the S2 switches are open. Thus, the $V_{DD}$ signal is applied across the bootstrap capacitor (308). At this time, the control signal (326) is essentially brought to zero by means of additional circuit elements as would be appreciated by those skilled in the relevant art. This will turn the switch to an OFF state.

Figure 3B:
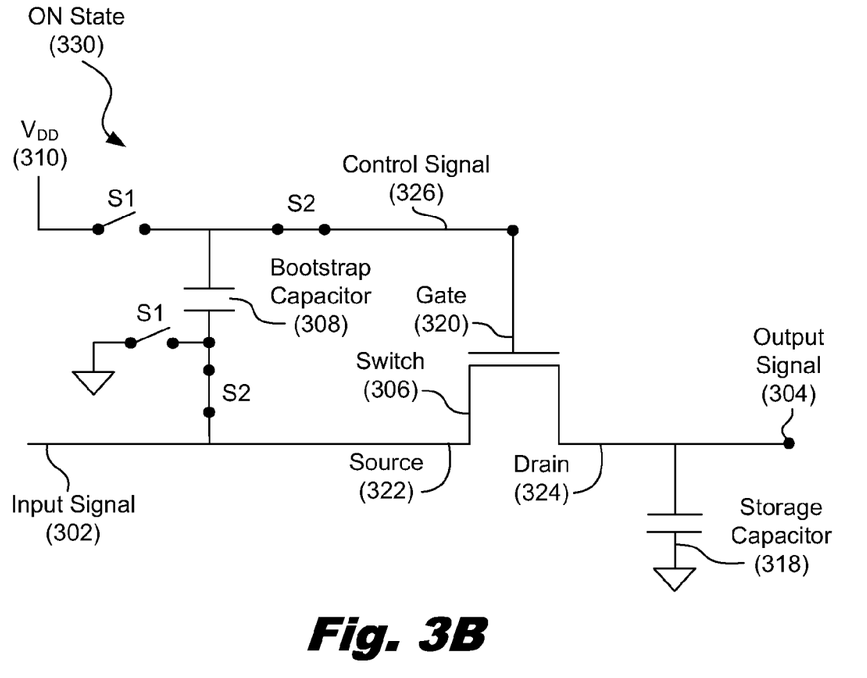
FIG. 3B is a diagram showing an illustrative schematic for a sample-and-hold circuit having a bootstrap circuit and being in an ON state, according to one example of principles described herein.

FIG. 3B is a diagram showing an illustrative circuit schematic of the sample-and-hold circuit while the main switch (306) is in the ON state (330). While in the ON state, the S2 switches are closed while the S1 switches are open. Thus, the control signal (326) between the bootstrap capacitor (308) and the gate terminal (320) is equal to the input signal (302) plus the voltage stored in the bootstrap capacitor, which is VDD (310). As a result, the voltage between the source terminal (322) and the gate terminal (306) will be a relatively constant value. Additionally, this relatively constant value is high enough to turn the switch into the ON state so that the input signal (302) passes through.

Figure 4:
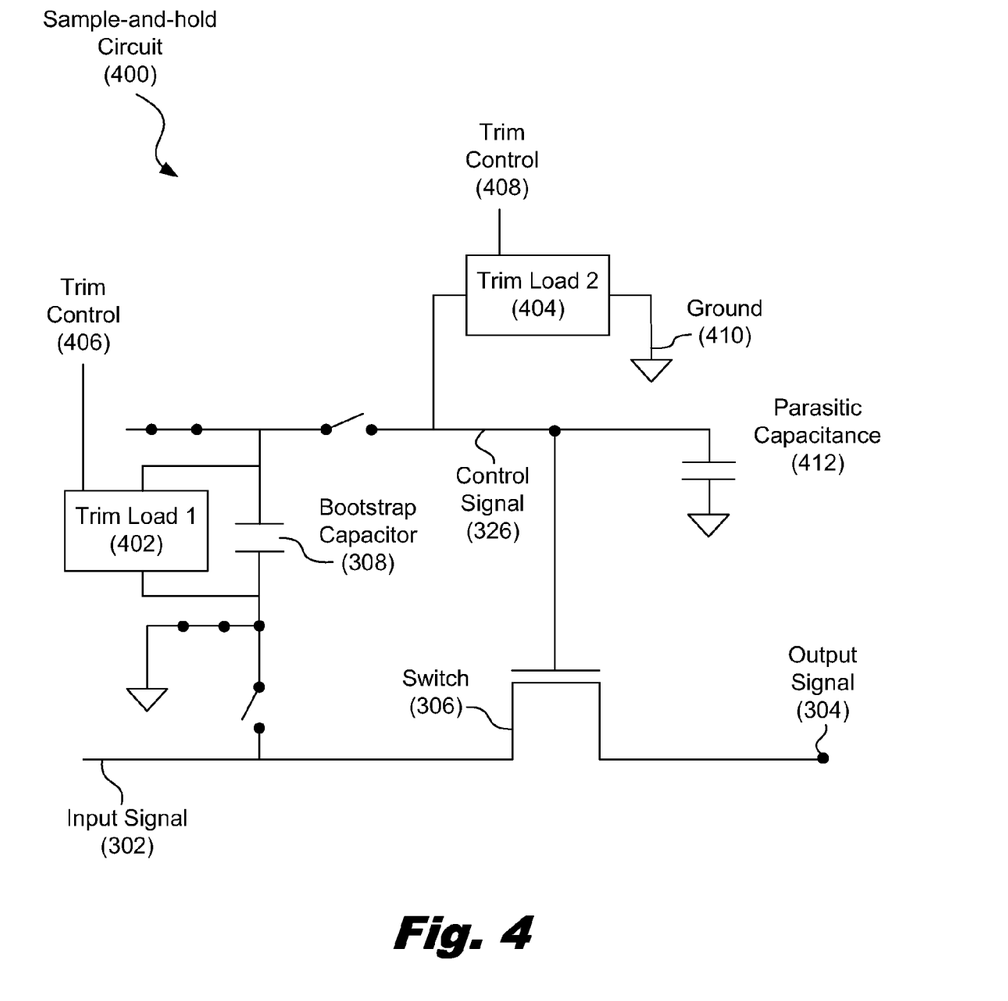
FIG. 4 is a diagram showing an illustrative sample-and-hold circuit with trim loads to adjust the efficiency of the bootstrap circuit, according to one example of principles described herein.

FIG. 4 is a diagram showing an illustrative sample-and-hold circuit (400) with trim loads to adjust the efficiency of the bootstrap circuit. As mentioned above, the frequency response of the sample-and-hold circuit is dependent upon the intrinsic resistance of the switch (306) while in the ON state as well as the capacitance of the storage capacitor (318). The intrinsic resistance of the switch is dependent upon the $V_{GS}$ of the switch. The $V_{GS}$ can be adjusted by affecting the efficiency of the bootstrap. The efficiency may be increased by adding additional capacitance to the bootstrap capacitor (308). Alternatively the efficiency may be reduced by adding additional capacitance between the control signal (326) and ground (410).

Reducing the efficiency of the bootstrap circuit will decrease the $V_{GS}$ of the switch (306). This, in turn, will increase the ON state intrinsic resistance of the switch (306). Increasing the ON state intrinsic resistance of the switch (306) will affect the frequency response of the sample-and-hold circuit. Specifically, it will reduce the bandwidth of the sample-and-hold circuit. The bandwidth of a low-pass filter refers to the range of frequencies between 0 hertz and the frequency at which the signal attenuates to −3 decibels.

Conversely, increasing the efficiency of the bootstrap circuit will increase the $V_{GS}$ of the switch (306). This, in turn will decrease the ON state intrinsic resistance of the switch (306). By decreasing the ON state intrinsic resistance of the switch (306), the bandwidth of the sample-and-hold circuit (400) is increased.

To adjust the capacitance of either the bootstrap capacitance or the gate capacitance, a trim load may be used. The trim load may be a circuit with an adjustable capacitive characteristic. The trim load may be controlled by a trim control signal (406, 408). For example, Trim Load 1 (402) is placed in parallel with the main bootstrap capacitor (308). To adjust the capacitance of Trim Load 1 (402) and provide additional capacitance to the bootstrap capacitor (308), a trim control signal (406) is used.

Additionally, Trim Load 2 (404) is placed between the control signal (326) and ground. This trim load is in addition to any parasitic capacitance (412) at the gate terminal of the switch (306). To adjust the capacitance of Trim Load 2 (404) and provide additional capacitance to the gate capacitance, a trim control signal (406) is used.

A sample-and-hold circuit embodying principles described herein may include either a trim load in parallel with the bootstrap capacitor (308), a trim load in parallel with the parasitic gate capacitance (412), or a trim load at both places. In the case of a trim load in parallel with only the bootstrap capacitor (308), the bandwidth of each sample-and-hold circuit within a time-interleaved ADC may be increased to match the sample-and-hold circuit of the sub-ADC exhibiting the highest bandwidth. In the case of a trim load in parallel with only gate capacitance (412), the bandwidth of each sample-and-hold circuit within a time-interleaved ADC may be decreased to match the bandwidth of the sample-and-hold circuit of the sub-ADC exhibiting the lowest bandwidth. In the case of a trim load at both locations, the bandwidth for each sub-ADC sample-and-hold circuit may be adjusted either up or down so that each sample-and-hold circuit exhibits a matching bandwidth. In one example, the trim load may be a capacitor bank.

Figure 5:
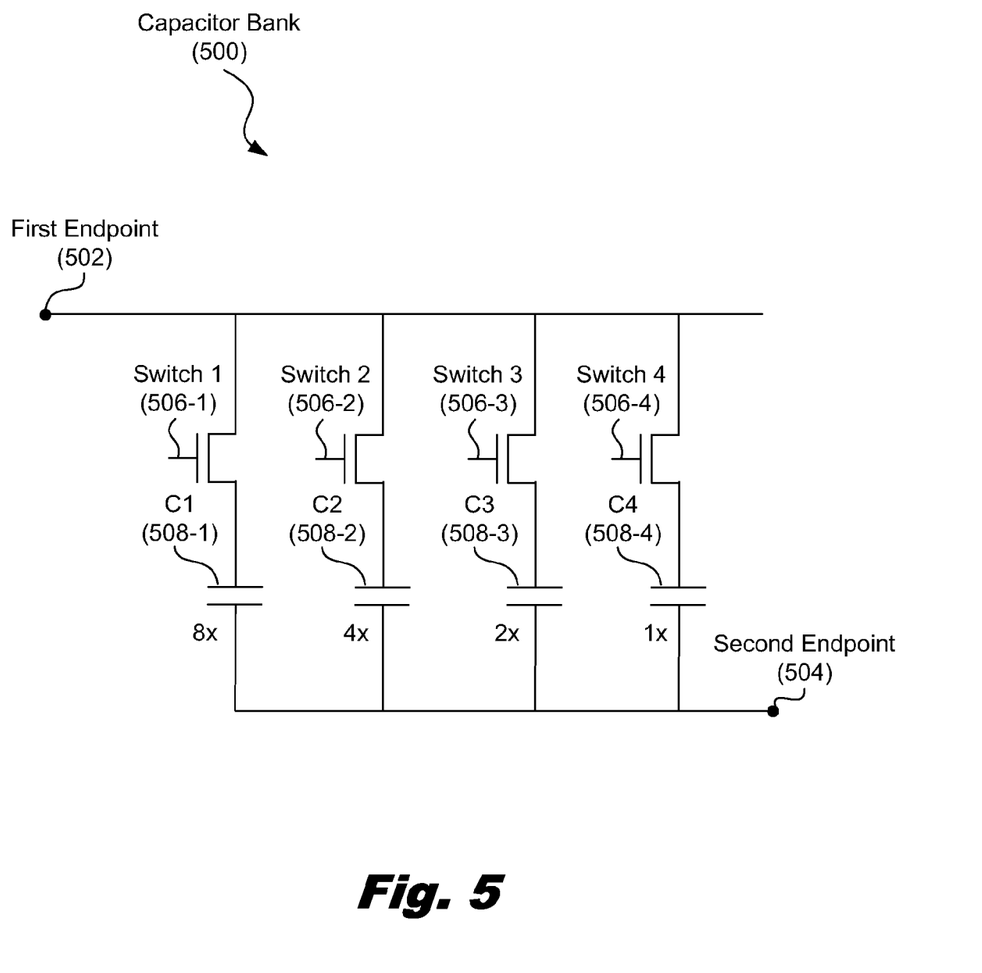
FIG. 5 is a diagram showing an illustrative capacitor bank, according to one example of principles described herein.

FIG. 4 is a diagram showing an illustrative capacitor bank (500). According to certain illustrative examples, the trim loads used within the sample-and-hold circuits may be capacitor banks. A capacitor bank (500) includes a set of capacitors in parallel between a first endpoint (502) and a second endpoint (504). These capacitors (508) are configured to selectively add to a total capacitance to the capacitor bank (500). In the case of decreasing bootstrap efficiency to reduce bandwidth, the capacitor bank (500) may be placed between the bootstrap control signal line (502) and ground (504). In the case of increasing bootstrap efficiency to increase bandwidth, the capacitor bank (500) may be placed in parallel with the main bootstrap capacitor.

In the capacitor bank (500) illustrated in FIG. 5, there are four capacitors (508) in parallel. Each capacitor is configured to selectively add to the total capacitance through use of a switch (506). Switch 1 (506-1) is connected to C1 (508-1), Switch 2 (506-2) is connected to C2 (508-2), Switch 3 (506-3) is connected to C3 (508-3), and Switch 4 (506-4) is connected to C4 (508-4). When a switch is in an ON state, and current is allowed to flow through that switch, then the capacitor associated with that switch will add to the total capacitance of the capacitor bank. If a particular switch is in an OFF state, then the capacitor associated with that switch will not materially add to the total capacitance between the first endpoint (502) and the second endpoint (504). By selecting a particular combination of capacitors to add to the total capacitance, a set of discrete capacitance values will be added to wherever the capacitor bank is placed. Additional capacitance, appropriately placed will effectively adjust the bandwidth of the frequency response of the sample-and-hold circuit.

In one example, the capacitor bank may be a binary weighted capacitor bank. In such a capacitor bank, each individual capacitor is twice the value of the next smallest capacitor. For example, C3 (508-3) may be twice the value of C4 (508-4), C2 (508-2) may be four times the value of C4 (508-

4), and C1 may be eight times the value of C4 (508-4). Thus, a capacitor bank with four binary weighted capacitors can take on 16 discrete total capacitance values.

In one example, a memory associated with the capacitor bank (500) may be used to store the setting for each switch (506). This memory may be, for example, a One Time Programmable (OTP) memory. Other types of memory which can permanently store the setting of the capacitor bank (500) may be used.

Using principles described herein, the frequency response for each sub-ADC within a manufactured time-interleaved ADC may be determined. Each of the frequency responses will be slightly different due to manufacturing variations. Each of the frequency responses of the sub-ADCs may then be adjusted by setting the trim load associated with the sample-and-hold circuit of those sub-ADCs. For example, the bandwidth of each sample-and-hold circuit may be reduced to match the bandwidth of the sample-and-hold circuit having the lowest bandwidth. Alternatively, the bandwidth for each sample-and-hold circuit may be increased to match the bandwidth of the sample-and-hold circuit having the highest bandwidth. Furthermore, if each sample-and-hold circuit within a time-interleaved ADC has two capacitor banks, one for increasing and one for decreasing bandwidth, then the bandwidth of each sample-and-hold circuit can be adjusted to a predetermined level. Thus, the bandwidth of some sample-and hold circuits will be increased while the bandwidth of others are reduced such that the bandwidth for each sample-and-hold circuit is matched. The settings for each of the capacitor banks may then be stored in a memory. Thus, these sample-and-hold circuits will maintain the frequency responses to which they are set during operation of the time-interleaved ADC.

Figure 6:
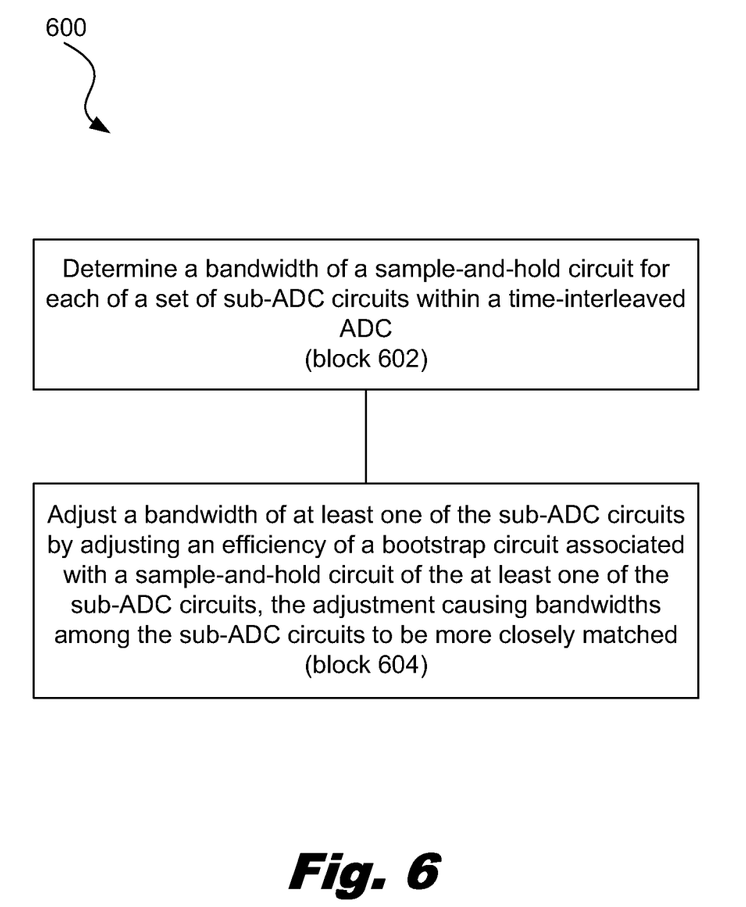
FIG. 6 is a flowchart showing an illustrative method for matching frequency responses of sub-ADC circuits within a time-interleaved ADC, according to one example of principles described herein.

FIG. 6 is a flowchart showing an illustrative method for matching frequency responses of sub-ADC circuits within a time-interleaved ADC. According to certain illustrative examples, the method includes determining (block 602) a frequency response of a sample-and-hold circuit for each of a set of sub-ADC circuits within a time-interleaved ADC, and adjusting (block 604) a bandwidth of at least one of the sub-ADC circuits by adjusting an efficiency of a bootstrap circuit associated with a sample-and-hold circuit of the at least one of the sub-ADC circuits, the adjustment causing bandwidths among the sub-ADC circuits to be more closely matched.

In conclusion, through use of methods and systems embodying principles described herein, a time-interleaved ADC circuit can be manufactured with a mechanism to adjust the frequency response of each sub-ADC circuit therein. Specifically, after manufacture, the frequency response of each sub-ADC circuit can be determined. Then, the capacitor bank for each of the sub-ADC circuits is adjusted to decrease the bandwidth of each sub-ADC circuit to match the bandwidth of the sub-ADC circuit having the smallest bandwidth.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A time-interleaved Analog-to-Digital Converter (ADC) comprising:
a set of sub-ADC circuits, each sub-ADC circuit comprising a sample-and-hold circuit;
wherein each sample-and-hold circuit comprises:
a bootstrap circuit for maintaining a constant voltage level between an input terminal of a switch and a gate terminal of said switch, said switch for switching between a sample mode and a hold mode; and
a capacitor bank associated with said bootstrap circuit such that a setting of said capacitor bank affects an ON state intrinsic resistance of said switch by affecting said voltage level.

2. The ADC of claim 1, wherein said capacitor bank is configured to be set after testing said ADC to adjust said frequency response of said sample-and-hold circuit.

3. The ADC of claim 1, further comprising a memory coupled to said capacitor bank, said memory configured to store a setting of said capacitor bank.

4. The ADC of claim 1, wherein said memory comprises a one-time programmable memory.

5. The ADC of claim 1, wherein said capacitor bank is connected between a control signal and ground, said control signal being between said bootstrap circuit and said gate terminal.

6. The ADC of claim 5, wherein said capacitor bank is connected in parallel to a main capacitor of said bootstrap circuit.

7. The ADC of claim 1, wherein said capacitor bank comprises a binary weighted capacitor bank.

8. A method for matching bandwidths within a time-interleaved Analog-to-Digital Converter (ADC), the method comprising:
determining a frequency response of a sample-and-hold circuit for each of a set of sub-ADC circuits within a time-interleaved ADC;
adjusting a bandwidth of at least one of said sub-ADC circuits by adjusting an efficiency of a bootstrap circuit associated with a sample-and-hold circuit of said at least one of said sub-ADC circuits, said adjusting causing bandwidths among said sub-ADC circuits to be more closely matched.

9. The method of claim 8, wherein adjusting said efficiency comprises adjusting a capacitive trim load.

10. The method of claim 9, wherein said capacitive trim load is placed in parallel to a main bootstrap capacitor of said sample-and-hold circuit of said at least one of said sub-ADC circuits to increase said bandwidth of said at least one sub-ADC circuit.

11. The method of claim 9, wherein said capacitive trim load is placed between a gate terminal of a switch of said sample-and-hold circuit of said at least one of said sub-ADC circuits and ground to increase said bandwidth of said at least one sub-ADC circuit.

12. The method of claim 9, wherein said capacitive trim load comprises a capacitor bank.

13. The method of claim 12, wherein said capacitor bank comprises a binary weighted capacitor bank.

14. The method of claim 12, further comprising, storing a setting of said capacitor bank setting into a memory associated with said capacitor bank.

15. The method of claim 8, further comprising, increasing a bandwidth of each of said sub-ADC circuits to match a bandwidth of the sub-ADC circuit within said time-interleaved ADC having the highest bandwidth.

16. The method of claim 8, further comprising, decreasing a bandwidth of each of said sub-ADC circuits to match a bandwidth of the sub-ADC circuit within said time-interleaved ADC having the smallest bandwidth.

17. A time-interleaved Analog-to-Digital Converter (ADC) comprising:
a set of time multiplexed sub-ADC circuits, each sub-ADC circuit comprising a sample-and-hold circuit;
wherein each sample-and-hold circuit comprises:

a bootstrap circuit for maintaining a constant voltage level between an input terminal of a switch and a gate terminal of said switch, said switch for switching between a sample mode and a hold mode; and a capacitor bank associated with said bootstrap circuit such that a setting of said capacitor bank affects an intrinsic resistance of said switch by adjusting said voltage level;

wherein, said capacitor bank is configured to be set to a value that will adjust a frequency response of said sample-and-hold circuit to a predetermined bandwidth.

18. The ADC of claim 17, further comprising a memory coupled to said capacitor bank, said memory configured to store a setting of said capacitor bank.

19. The ADC of claim 18, wherein said memory comprises a one-time programmable memory.

20. The ADC of claim 17, wherein said capacitor bank comprises a binary weighted capacitor bank.

* * * * *